United States Patent
Komurasaki et al.

(10) Patent No.: US 6,826,393 B1
(45) Date of Patent: Nov. 30, 2004

(54) MIXER CIRCUIT HAVING COMPONENT FOR FREQUENCY CONVERSION

(75) Inventors: Hiroshi Komurasaki, Hyogo (JP); Hisayasu Sato, Hyogo (JP); Takahiro Miki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/547,920

(22) Filed: Apr. 11, 2000

(30) Foreign Application Priority Data

Oct. 13, 1999 (JP) ............................................ 11-291165

(51) Int. Cl.$^7$ ................................................ H04B 1/28
(52) U.S. Cl. ...................... 455/326; 455/319; 455/327; 455/333; 327/359; 327/361
(58) Field of Search ................... 455/326, 333, 455/329, 318, 323, 280, 319, 293, 91, 118, 119, 325, 327, 324, 341, 317; 327/113, 357, 359, 361, 551; 323/315, 316, 312

(56) References Cited

U.S. PATENT DOCUMENTS

| | | | | |
|---|---|---|---|---|
| 4,233,607 A | | 11/1980 | Sanford et al. | 343/700 |
| 4,636,663 A | * | 1/1987 | Jongepier et al. | 327/113 |
| 4,937,516 A | * | 6/1990 | Sempel | 323/315 |
| 5,060,293 A | | 10/1991 | Kok et al. | 455/78 |
| 5,264,862 A | | 11/1993 | Kumpfbeck | 343/853 |
| 5,329,189 A | * | 7/1994 | Ushida et al. | 327/355 |
| 5,379,457 A | | 1/1995 | Nguyen | |
| 5,515,014 A | * | 5/1996 | Troutman | 332/178 |
| 5,521,545 A | * | 5/1996 | Terry et al. | 327/357 |
| 5,771,449 A | | 6/1998 | Blasing et al. | 455/422 |
| 5,815,805 A | | 9/1998 | Crnkovic et al. | 455/78 |
| 5,847,623 A | * | 12/1998 | Hadjichristos | 322/105 |
| 5,859,558 A | * | 1/1999 | Chen et al. | 327/355 |
| 5,884,154 A | * | 3/1999 | Sano et al. | 455/321 |
| 5,973,539 A | * | 10/1999 | Komurasaki et al. | 327/359 |
| 6,026,286 A | * | 2/2000 | Long | 455/327 |
| 6,094,571 A | * | 7/2000 | Groe | 455/333 |
| 6,122,497 A | * | 9/2000 | Gilbert | 455/333 |
| 6,184,739 B1 | * | 2/2001 | Doyle | 327/359 |
| 6,230,001 B1 | * | 5/2001 | Wyse | 455/326 |
| 6,255,889 B1 | * | 7/2001 | Branson | 327/359 |
| 6,345,178 B1 | * | 2/2002 | Haapala | 455/326 |
| 6,404,263 B1 | * | 6/2002 | Wang | 327/359 |
| 2001/0018334 A1 | * | 8/2001 | Ipek et al. | 455/318 |

FOREIGN PATENT DOCUMENTS

| | | |
|---|---|---|
| CA | 2095304 | 4/1993 |
| DE | 4114943 A1 | 11/1991 |
| DE | 4410030 A1 | 1/1995 |
| JP | 60-38905 | 2/1985 |
| JP | 4-17405 | 1/1992 |
| JP | 10-322135 | 12/1998 |

OTHER PUBLICATIONS

"RF Analog and Digital Circuits in SiGe Technology", J.R. Long et al., 1996 IEEE International Solid–State Circuits Conference, Digest of Technical Papers, Feb. 8, 1996, pp. 82–83.

* cited by examiner

*Primary Examiner*—Pablo N. Tran
(74) *Attorney, Agent, or Firm*—McDermott, Will & Emery LLP

(57) ABSTRACT

A mixer circuit according to the present invention includes a first differential transistor pair of two transistors, a second differential transistor pair of two transistors, an impedance element connected to the first differential transistor pair, an impedance element connected to the second differential transistor pair, an inductor connected to nodes A, B, a current source connected to node A, a current source connected to node B, and a capacitor. A mixer circuit with high conversion gain and small distortion can be obtained.

5 Claims, 14 Drawing Sheets

MIXER CIRCUIT HAVING COMPONENT FOR FREQUENCY CONVERSION

BACKGROUND OF THE INVENTION

1. Field of the Invention

The present invention relates to mixer circuits, and more particularly to a high gain mixer circuit.

2. Description of the Background Art

A conventional Gilbert cell type mixer circuit 1000 will be described with reference to FIG. 12. Mixer circuit 1000 includes a constant current source 1007 which supplies a constant current 2×IEE, and transistors 1003 to 1006. Here, V1, V2, i1, and i2 denote a first input voltage, a second input voltage, a first output current, and a second output current, respectively.

Transistors 1003, 1004 have their emitter terminals connected commonly to each other, and transistors 1005, 1006 also have their emitter terminals connected commonly to each other. Transistors 1003, 1005 have their collector terminals connected commonly to each other, and transistors 1004, 1006 also have their collector terminals connected commonly to each other.

The collector terminal of transistor 1001 is connected to the common emitter terminal of transistors 1003, 1004, and the collector terminal of transistor 1002 is connected to the common emitter terminal of transistors 1005, 1006.

Transistors 1001, 1002 have their emitter terminals connected to constant current source 1007.

Mutually complementary voltages V1+, V1− are input to the bases of transistors 1001, 1002. Voltage V2+ is input to the bases of transistors 1003, 1006, and voltage V2− is input to the bases of transistors 1004, 1005. Voltages V2+, V2− are mutually complementary.

First output current i1 is output from the collector terminals of transistors 1003, 1005, and second output current i2 is output from the collector terminals of transistors 1004, 1006.

The operation will be described in the following. First input voltage V1 and second input voltage V2 are signals having mutually different frequencies f1, f2. The input signals having frequency f1 are converted to the collector currents of transistors 1001, 1002 and amplified by an emitter coupled pair circuit which is formed of transistors 1001, 1002.

The collector currents of transistors 1001, 1002 serve as a tail current for an emitter coupled pair circuit which is formed of transistors 1003, 1004 and for an emitter coupled pair circuit which is formed of transistors 1005, 1006.

The input signals having frequency f2 are amplified respectively by the emitter coupled pair circuit which is formed of transistors 1003, 1004 and by the emitter coupled pair circuit which is formed of transistors 1005, 1006.

This relation is represented by the following equations. Here, VT is a thermal voltage, V1=(V1+)−(V1−), and V2=(V2+)−(V2−). The collector currents of transistors 1001, 1002 are ic1, ic2 which are represented by equations (1), (2).

$$ic1 = 2IEE/\{1+\exp(-V1/VT)\} \quad (1)$$

$$ic2 = 2IEE/\{1+\exp(V1/VT)\} \quad (2)$$

When the collector currents of transistors 1003, 1004, 1005, and 1006 are ic3, ic4, ic5, and ic6, then ic3 to ic6 are represented by equations (3) to (6).

$$ic3 = ic1/\{1+\exp(-V2/VT)\} \quad (3)$$

$$ic4 = ic1/\{1+\exp(V2/VT)\} \quad (4)$$

$$ic5 = ic2/\{1+\exp(V2/VT)\} \quad (5)$$

$$ic6 = ic2/\{1+\exp(-V2/VT)\} \quad (6)$$

From equations (1) to (6), ic3, ic4, ic5, ic6, V1, and V2 satisfy equations (7) to (10).

$$ic3 = 2IEE/[\{1+\exp(-V1/VT)\}\cdot\{1+\exp(-V2/VT)\}] \quad (7)$$

$$ic4 = 2IEE/[\{1+\exp(-V1/VT)\}\cdot\{1+\exp(V2/VT)\}] \quad (8)$$

$$ic5 = 2IEE/[\{1+\exp(V1/VT)\}\cdot\{1+\exp(V2/VT)\}] \quad (9)$$

$$ic6 = 2IEE/[\{1+\exp(V1/VT)\}\cdot\{1+\exp(-V2/VT)\}] \quad (10)$$

From the forgoing, the differential output current is represented by the following expression.

$$i1-i2 = ic3+ic5-(ic6+ic4) = 2IEE\cdot\{\tanh(V1/2VT)\}\cdot\{\tanh(V2/2VT)\} \quad (11)$$

Here, tanh can be expanded in series as in equation (12). If x is sufficiently smaller than 1, equation (13) is formed.

$$\tanh(x) = x - x\cdot x\cdot x/3 \quad (12)$$

$$\tanh(x) \approx x \quad (13)$$

The relation between input voltages V1, V2 and differential output currents i1, i2 is represented by equation (14).

$$i1-i2 \approx 2IEE\cdot(V1/2VT)\cdot(V2/2VT) \quad (14)$$

In short, mixer circuit 1000 is a circuit for multiplying input voltages V1, V2. That is, input voltages V1, V2 are signals having mutually different frequencies f1, f2. Therefore, by multiplying the two signals, mixer circuit 1000 performs the mixer operation of outputting a signal having a frequency component of the sum (|f1+f2|) or the difference (|f1−f2|) of the frequencies of the two signals.

In the following, each of mixer circuits 1100, 1300 disclosed in Japanese Patent Laying-Open No. 10-322135 will be described.

A low voltage type mixer circuit 1100 will be first described with reference to FIG. 13. Mixer circuit 1100 includes constant current sources 1015, 1016 which supply a constant current IEE, transistors 1011 to 1014, and a 180° phase shifter 1017. Here, in1, in2, Out+, and Out− are a first input signal, a second input signal, a positive output current, and a negative output current, respectively.

Transistors 1011, 1012 have their emitter terminals connected commonly to each other, and transistors 1013, 1014 also have their emitter terminals connected to each other. Transistors 1011, 1013 have their collector terminals connected commonly to each other, and transistors 1012, 1014 also have their collector terminals connected commonly to each other.

The common emitter terminal of transistors 1011, 1012 is connected to constant current source 1015 via a node A. The common emitter terminal of transistors 1013, 1014 is connected to constant current source 1016 via a node B. First input signal in1 is input to node A. Between node A and node B, the 180° phase shifter is provided. The common emitter terminal of transistors 1011, 1012 and the common emitter terminal of transistors 1013, 1014 are connected via 180° phase shifter 1017.

Signal in2+ is input to the bases of transistors 1011, 1013, and signal in2− is input to the bases of transistors 1012, 1013. Positive output current Out+ is output from the common collector terminal of transistors 1011, 1013, and negative output current Out− is output from the common collector terminal of transistors 1012, 1014.

180° phase shifter 1017 outputs to node B a signal which has its phase inverted by 180° from that of first input signal in1 at node A. If the current component of first input signal in1 is iin1, current iA is iA=IEE+iin1 and current iB B is iB=IEE−iin1.

The operation will be described in the following. First input signal in1 and second input signal in2 are signals having mutually different frequencies f1, f2. The common emitter terminal of transistors 1011, 1012 and the common emitter terminal of transistors 1013, 1014 are connected commonly via 180° phase shifter 1017. Therefore, differential input currents are obtained at the common emitter terminal of the coupled pair which is formed of transistors 1011, 1012 and at the common emitter terminal of the coupled pair which is formed of transistors 1013, 1014.

Since the complementary input signals are obtained at nodes A, B, the current amplitude is twice as high as the one-side input type described above. Therefore, the mixer operation is performed while suppressing the decrease of conversion gain as much as possible.

Suppose that the collector currents of transistors 1011, 1012, 1013, and 1014 are ic1, ic2, ic3, and ic4, respectively, and vin2=(in2+)−(in2−).

$$ic1 = (IEE + iin1)/\{1 + \exp(-vin2/VT)\} \quad (15)$$

$$ic2 = (IEE + iin1)/\{1 + \exp(vin2/VT)\} \quad (16)$$

$$ic3 = (IEE - iin1)/\{1 + \exp(vin2/VT)\} \quad (17)$$

$$ic4 = (IEE - iin1)/\{1 + \exp(-vin2/VT)\} \quad (18)$$

From the relations of expressions (15) to (18), the output current represented by expression (19) is obtained.

$$(Out+) - (Out-) = ic1 + ic3 - (ic2 + ic4) \quad (19)$$
$$= 2iin1 \cdot \{\exp(vin2/VT) - \exp(-vin2/VT)\}$$
$$/ [\{1 + \exp(vin2/VT)\} \cdot \{1 + \exp(-vin2/VT)\}]$$
$$= 2iin1 \cdot \tanh(vin2/2VT)$$

Using the relations of expressions (12) and (13), expression (19) is rewritten as in expression (20).

$$(Out+)-(Out-) \approx 2iin1 \cdot (vin2/2VT) \quad (20)$$

Therefore, iin1 and vin2 can be multiplied by using mixer circuit 1100. In the case of the one-side input type, the coefficient 2 of iin1 in expression (20) becomes 1.

Since mixer circuit 1100 has one stage of vertically connected transistors other than the constant current source, it operates at a lower power supply voltage as compared with the Gilbert cell type mixer circuit having two stages of vertically connected transistors. It is noted however that 180° phase shifter 1017 has to operate at a lower power supply voltage than that of the mixer portion or has to be formed of a passive element.

If 180° phase shifter 1017 is formed of a passive element, it has linear properties as compared with the lower stage coupled pair of the Gilbert cell and thus causes much smaller distortion.

In the following, a lower voltage type mixer circuit 1300 will be described with reference to FIG. 14. Mixer circuit 1300 includes constant current sources 1035, 1036 which supply a constant current IEE, transistors 1031 to 1034, an inductor 1037, and a capacitor 1038. Here, in1, in2, Out+, and Out− denote a first input signal, a second input signal, a positive first output current, and a negative first output current, respectively. The inductance of inductor 1037 is LE, and the capacitance of capacitor 1038 is CE.

Transistors 1031, 1032 have their emitter terminals connected commonly to each other, and transistors 1033, 1034 also have their emitter terminals connected commonly to each other. Transistors 1031, 1033 have their collector terminals connected commonly to each other, and transistors 1032, 1034 also have their collector terminals connected commonly to each other.

The common emitter terminal of transistors 1031, 1032 is connected to constant current source 1035 via node A. The common emitter terminal of transistors 1033, 1034 is connected to constant current source 1036 via node B. Inductor 1037 is provided between nodes A and B. Node B is connected to a ground via capacitor 1038. First input signal in1 is input to node A. Signal in2+ is input to the bases of transistors 1031, 1034, and signal in2− is input to the bases of transistors 1032, 1033.

If inductor 1037 and capacitor 1038 satisfy $f1 > 1/\{2\pi\sqrt{(LE \cdot CE)}\}$, a signal which has its phase inverted by 180° from that of input signal in1 can be obtained at node B.

However, the resistance component (emitter resistance in this case) of transistors 1033, 1034 at node B is small. As represented in the following expression, therefore, it is less possible that the phase difference between a voltage signal VA at node A and a voltage signal VB at node B attains 180° as Recp becomes smaller.

It is noted that Recp is produced by parallel combination of the emitter resistance of transistors 1033, 1034 and it is small-signal equivalent resistance.

$$VB/VA = Recp/(1+j\omega \cdot CE \cdot Recp)/\{j\omega LE \cdot Recp/(1+j\omega \cdot CE \cdot Recp)\} = Recp/\{j\omega LE + (Recp - \omega \cdot \omega LE \cdot CE \cdot Recp)\} \quad (21)$$

If the phase difference of the two signals does not attain 180°, the differential signal of the two signals is represented by the following expression. The amplitude of the two signals is 1, VA=sinωt, and VB=sin(ωt+θ).

$$VA - VB = \sin\omega t - \sin(\omega t + \theta) \quad (22)$$
$$= 2\sin(-\theta/2) \cdot \cos(\omega t + \theta/2)$$

In other words, the input signal becomes smaller as the absolute value of θ is smaller than 180° as represented by expression (22). Thus, the conversion gain is reduced.

Since Recp used in expression (21) is nonlinear resistance which varies with second input signal in2, distortion is caused.

In the conventional mixer circuits as described above, the input signal becomes smaller as the absolute value θ in expression (22) is smaller than 180°, and thus the conversion gain is reduced. Further, Recp as the parallel combination of the emitter resistance of transistors 1033, 1034 is nonlinear resistance which varies with second input signal in2, which causes distortion.

SUMMARY OF THE INVENTION

Therefore, the present invention provides a mixer circuit capable of realizing a high conversion gain.

A mixer circuit according to one aspect of the present invention includes: a first node to which a first input signal is input; a second input; a first output terminal from which a first component of an output signal is output; a second output terminal from which a second component of the output signal is output; a first transistor having a first control electrode to which a first component of a second input signal is input, a first electrode connected to the first output terminal, and a second electrode; a second transistor having a second control electrode to which a second component of the second input signal is input, a third electrode connected to the second output terminal, and a fourth electrode; a third transistor having a third control electrode to which the second component of the second input signal is input, a fifth electrode connected to the first output terminal, and a sixth electrode; a fourth transistor having a fourth control electrode to which the first component of the second input signal is input, a seventh electrode connected to the second output terminal, and an eighth electrode; a current source to supply a prescribed current to the first and second nodes; a phase conversion circuit provided between the first and second nodes to convert the phase of the first input signal and supply it to the second node; and a correction circuit provided between a first connection node for connecting the second and fourth electrodes and the first node or between a second connection node for connecting the sixth and eighth electrodes and the second node.

Preferably, the correction circuit includes a first impedance element, which is not open to direct current, provided between the first connection node and the first node, and a second impedance element, which is not open to direct current, provided between the second connection node and the second node. Alternatively, the correction circuit includes a first resistance element provided between the first connection node and the first node, and a second resistance element provided between the second connection node and the second node.

Therefore, the phase difference between signals at the first and second nodes becomes 180° and the conversion gain is increased.

Preferably, the correction circuit includes a first inductor provided between the first connection node and the first node, and a second inductor provided between the second connection node and the second node. Alternatively, the correction circuit includes a transformer having a first inductor provided between the first connection node and the first node and a second inductor provided between the second connection node and the second node.

Therefore, the harmonic components of signals at the first and second nodes, which are input to the common emitter terminal of the first and second transistors and the common emitter terminal of the third and fourth transistors, can be reduced. Since the direct current loss in the inductors is small, the mixer circuit is especially suitable for low voltage operation.

Preferably, the correction circuit includes a first filter provided between the first connection node and the first node, and a second filter provided between the second connection node and the second node.

Therefore, the harmonic components of signals at the first and second nodes, which are input to the common emitter terminal of the first and second transistors and the common emitter terminal of the third and fourth transistors, can be reduced.

Preferably, the phase conversion circuit includes an inductor connected between the first and second nodes, and a capacitance element connected between the second node and a node supplied with a ground voltage. Alternatively, the phase conversion circuit includes a 180° phase converter to convert the phase of a signal at the first node by 180° and supply it to the second node.

Preferably, the mixer circuit further includes a fifth transistor connected between the first connection node and the correction circuit and receiving a prescribed bias voltage at a control electrode, and a sixth transistor connected between the second connection node and the correction circuit and receiving a prescribed bias voltage at a control electrode.

Therefore, the distortion in the mixer circuit can be reduced.

The present invention also provides a mixer circuit capable of realizing a high conversion gain and reducing distortion.

A mixer circuit according to a further aspect of the present invention includes: a first node to which a first input signal is input; a second node; a first output terminal from which a first component of an output signal is output; a second output terminal from which a second component of the output signal is output; a first transistor having a first control electrode to which a first component of a second input signal is input, a first electrode connected to the first output terminal, and a second electrode; a second transistor having a second control electrode to which a second component of the second signal is input, a third electrode connected to the second output terminal, and a fourth electrode; a third transistor having a third control electrode to which the second component of the second input signal is input, a fifth electrode connected to the first output terminal, and a sixth electrode; a fourth transistor having a fourth control electrode to which the first component of the second input signal is input, a seventh electrode connected to the second output terminal, and an eighth electrode; a current source to supply a prescribed current to the first and second nodes; a phase conversion circuit provided between the first and second nodes to convert the phase of a signal at the first node and supply it to the second node; a fifth transistor provided between a first connection node for connecting the second and fourth electrodes and the first node and having a fifth control electrode receiving a prescribed bias voltage; and a sixth transistor provided between a second connection node for connecting the sixth and eighth electrodes and the second node and having a sixth control electrode receiving a prescribed bias voltage.

Therefore, the distortion in the mixer circuit can be reduced.

Preferably, the phase conversion circuit includes an inductor connected between the first and second nodes, and a capacitance element connected between the second node and a node supplied with a ground voltage. Alternatively, the phase conversion circuit includes a 180° phase converter to convert the phase of a signal at the first node by 180° and supply it to the second node.

Preferably, the mixer circuit further includes a first inductor provided between the first node and the fifth transistor, and a second inductor provided between the second node and the sixth transistor.

Therefore, the harmonic components of signals at the first and second nodes, which are input to the common emitter terminal of the first and second transistors and the common emitter terminal of the third and fourth transistors can be reduced. Since the direct current loss in the inductors is small, the mixer circuit is especially suitable for low voltage operation.

Preferably, the mixer circuit further includes a first impedance element, which is not open to direct current, provided between the first node and the fifth transistor, and a second impedance element, which is not open to direct current, provided between the second node and the sixth transistor.

Therefore, the phase difference between signals at the first and second nodes becomes 180° and the conversion gain is increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
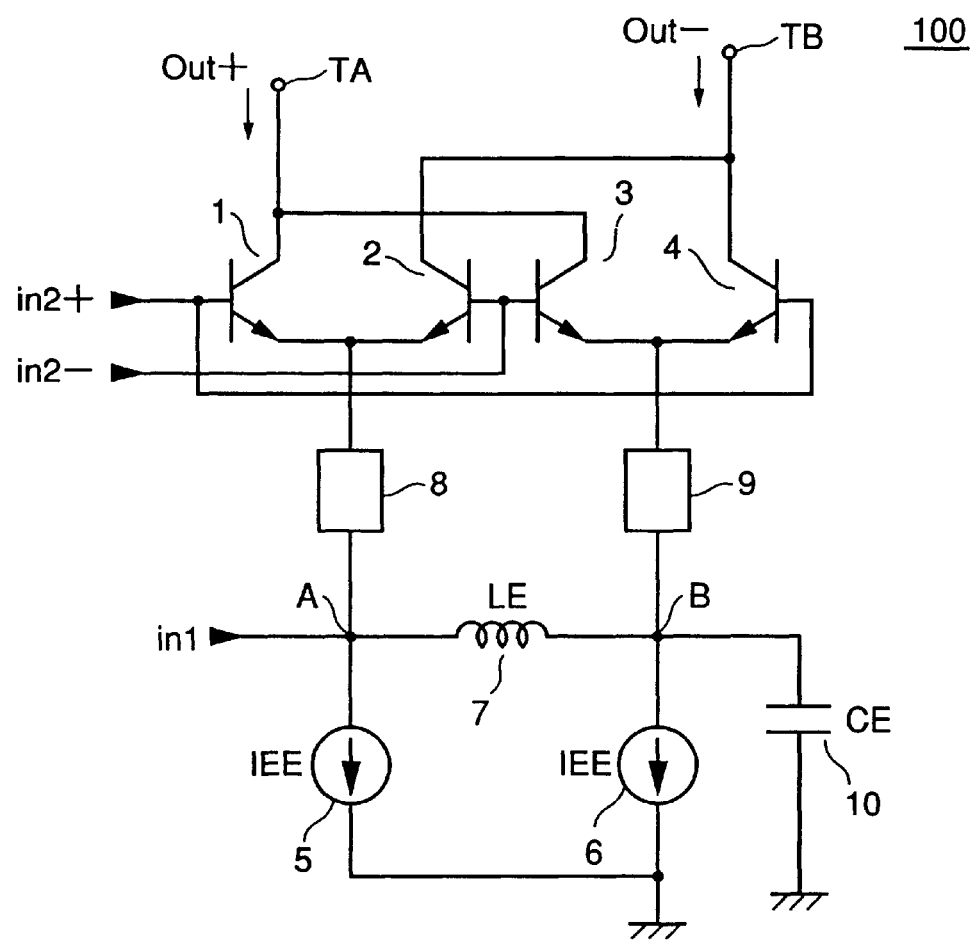
FIG. 1 is a circuit diagram of a mixer circuit 100 according to a first embodiment of the present invention.

The present invention will be described in the following. A mixer circuit 100 according to a first embodiment will be described with reference to FIG. 1. Mixer circuit 100 includes constant current sources 5, 6, transistors 1 to 4, an inductor 7, a capacitor 10, and impedance elements 8, 9 which are not open to direct current. Here, in1, in2+, in2−, Out+, and Out− denote a first input signal, a positive second input signal, a negative second input signal, a positive output current, and a negative output current, respectively.

Each of constant current sources 5, 6 supplies a constant current IEE. The impedance of each of impedance elements 8, 9 is Zp. The inductance of inductor 7 is LE, and the capacitance of capacitor 10 is CE.

The emitter terminals of transistors 1, 2 are connected commonly to each other, and the emitter terminals of transistors 3, 4 are also connected commonly to each other. The collector terminals of transistors 1, 3 are connected commonly to each other, and the collector terminals of transistors 2, 4 are also connected commonly to each other. The base terminals of transistors 1, 4 are supplied with positive second input signal in2+, and the base terminals of transistors 2, 3 are supplied with negative second input signal in2−.

The common emitter terminal of transistors 1, 2 is connected to constant current source 5 via impedance element 8. The common emitter terminal of transistors 3, 4 is connected to constant current source 6 via impedance element 9. Impedance element 8 is connected to constant current source 5 via node A. Impedance element 9 is connected to constant current source 6 via node B. Node A is connected to node B via inductor 7. Node B is connected to a ground via capacitor 10. First input signal in1 is input to node A.

The common collector terminal of transistors 1, 3 is connected to an output terminal TA. Output current (Out+) is output from output terminal TA. The common collector terminal of transistors 2, 4 is connected to an output terminal TB. Output current (Out−) is output from output terminal TB.

First input signal in1 and second input signal in2 (=(in2+)−(in2−)) are signals having mutually different frequencies f1, f2. Signals in2+, in2− are converted to the collector currents of transistors 1, 2 and amplified by a coupled pair which is formed of transistors 1, 2. Signals in2+, in2− are converted to the collector currents of transistors 3, 4 and amplified by a coupled pair which is formed of transistors 3, 4. The sum of the collector currents of transistors 1, 3 is output current Out+, and the sum of the collector currents of transistors 2, 4 is output current Out−.

According to the first embodiment, if the parallel combination of the emitter resistance of transistors 3, 4 is Recp, impedance Zp is added in series with Recp and the total impedance at node B increases. In other words, from expression (21), the phase difference between signals at nodes A, B approaches 180° and the conversion gain increases.

Second Embodiment

Figure 2:
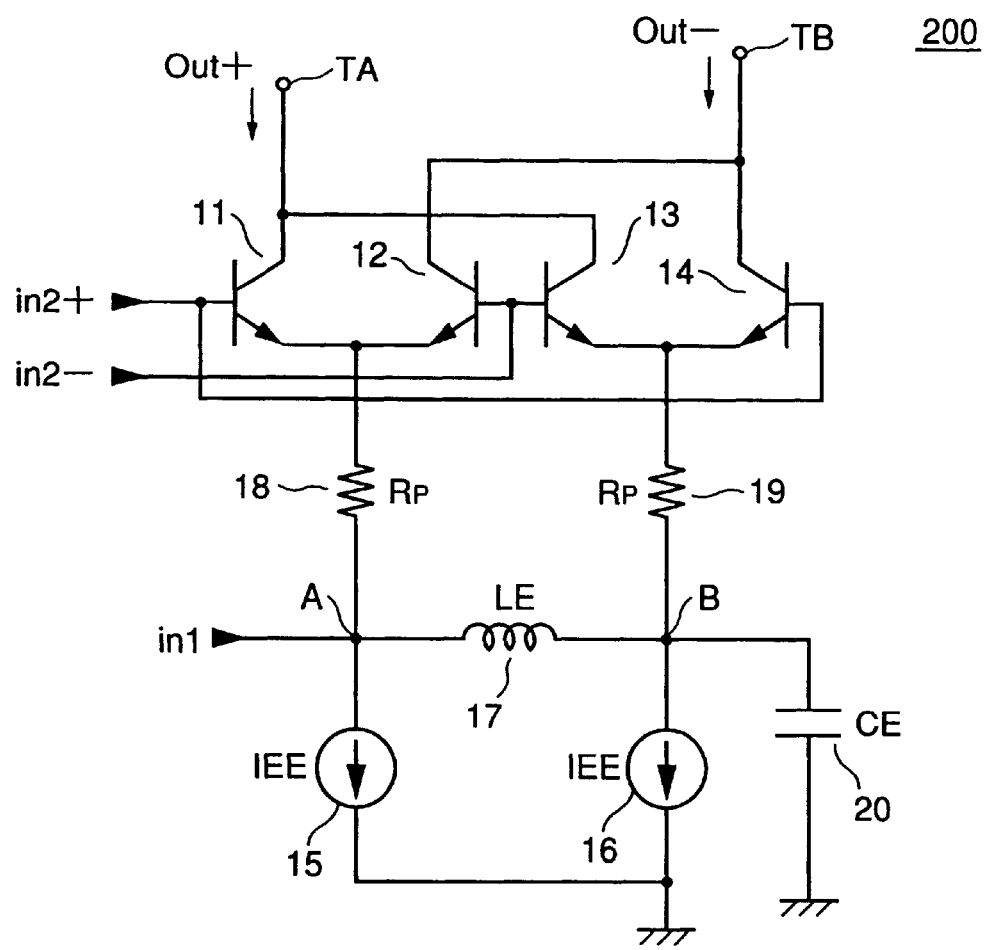
FIG. 2 is a circuit diagram of a mixer circuit 200 according to a second embodiment of the present invention.

A mixer circuit 200 according to a second embodiment will be described with reference to FIG. 2. Mixer circuit 200 includes constant current sources 15, 16, transistors 11 to 14, an inductor 17, a capacitor 20, and resistance elements 18, 19. Here, in1, in2+, in2−, Out+, and Out− denote a first input signal, a positive second input signal, a negative second input signal, a positive output current, a negative output current, respectively.

Each of constant current sources 15, 16 supplies a constant current IEE. The resistance value of each of resistance elements 18, 19 is Rp, the inductance of inductor 17 is LE, and the capacitance of capacitor 20 is CE.

The emitter terminals of transistors 11, 12 are connected commonly to each other, and the emitter terminals of transistors 13, 14 are also connected commonly to each other. The collector terminals of transistors 11, 13 are connected commonly to each other , and the collector terminals of transistors 12, 14 are also connected commonly to each other. The base terminals of transistors 11, 14 are supplied with positive second input signal in2+, and the base terminals of transistors 12, 13 are supplied with negative second input signal in2−.

The common emitter terminal of transistors 11, 12 is connected to constant current source 15 via resistance element 18. The common emitter terminal of transistors 13, 14 is connected to constant current source 16 via resistance element 19. Resistance element 18 is connected to constant current source 15 via node A, and resistance element 19 is connected to constant current source 16 via node B. Node A is connected to node B via inductor 17. Node B is connected to a ground via capacitor 20. First input signal in1 is input to node A.

The common collector terminal of transistors 11, 13 is connected to an output terminal TA. Output current (Out+) is output from output terminal TA. The common collector terminal of transistors 12, 14 is connected to an output terminal TB. Output current (Out−) is output from output terminal TB.

According to the second embodiment, similarly to the first embodiment, if the parallel combination of the emitter resistance of transistors 13, 14 is Recp, a resistance value Rp is added in series with Recp and the total impedance at node B increases. In other words, from expression (21), the phase difference between signals at nodes A, B approaches 180° and the conversion gain increases.

Third Embodiment

Figure 3:
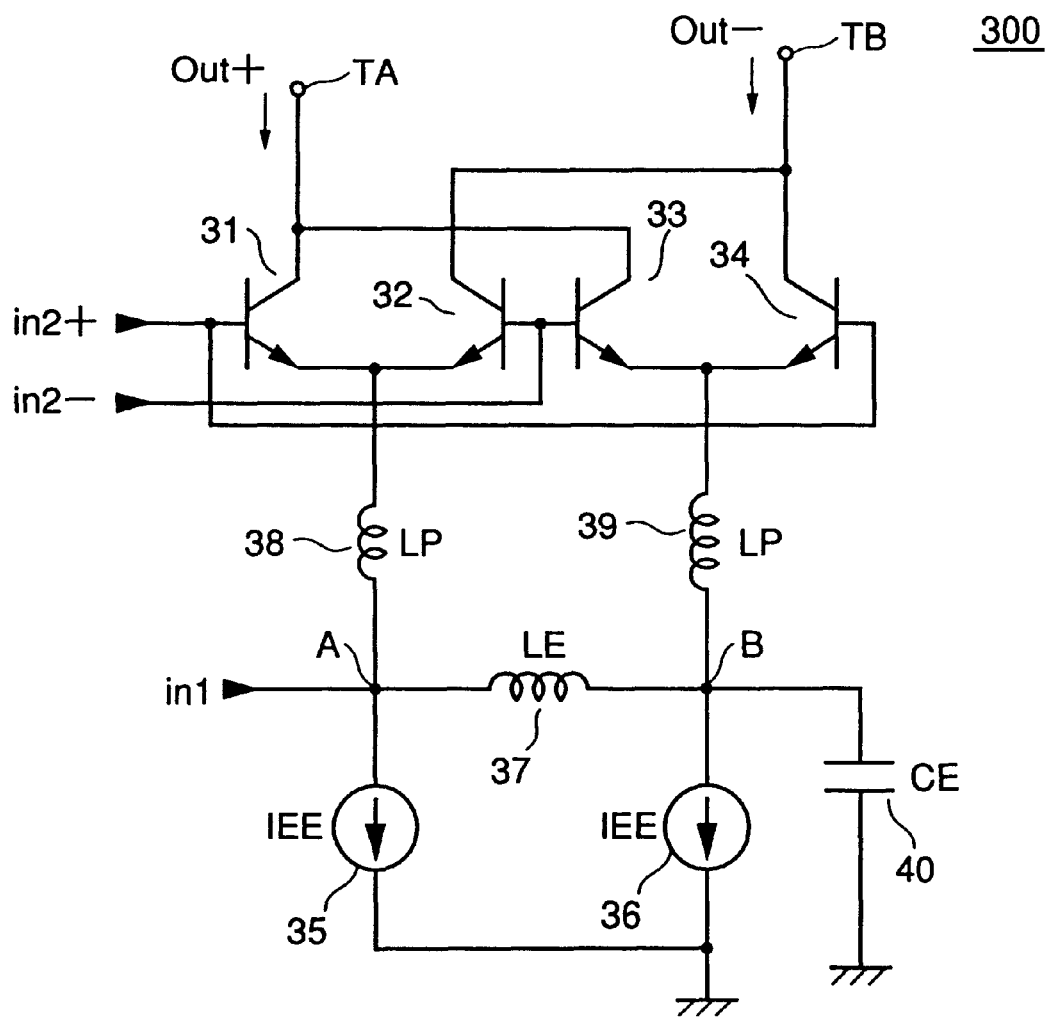
FIG. 3 is a circuit diagram of a mixer circuit 300 according to a third embodiment of the present invention.

A mixer circuit 300 according to a third embodiment will be described with reference to FIG. 3. Mixer circuit 300 includes constant current sources 35, 36, transistors 31 to 34, inductors 37, 38, 39, and a capacitor 40. Here, in1, in2+, in2−, Out+, and Out− denote a first input signal, a positive second input signal, a negative second input signal, a positive output current, and a negative output current, respectively.

Each of constant current sources 35, 36 supplies a constant current IEE. The inductance of inductor 37 is LE, the inductance of each of inductors 38, 39 is LP, and the capacitance of capacitor 40 is CE.

The emitter terminals of transistors 31, 32 are connected commonly to each other, and the emitter terminals of transistors 33, 34 are also connected commonly to each other. The collector terminals of transistors 31, 33 are connected commonly to each other, and the collector terminals of transistors 32, 34 are also connected commonly to each other. The base terminals of transistors 31, 34 are supplied with positive second input signal in2+, and the base terminals of transistors 32, 33 are supplied with negative second input signal in2−.

The common emitter terminal of transistors 31, 32 is connected to constant current source 35 via inductor 38. The common emitter terminal of transistors 33, 34 is connected to constant current source 36 via inductor 39. Inductor 38 is connected to constant current source 35 via node A, and inductor 39 is connected to constant current source 36 via node B. Node A is connected to node B via inductor 37. Node B is connected to a ground via capacitor 40. First input signal in1 is input to node A.

The common collector terminal of transistors 31, 33 is connected to an output terminal TA. Output current (Out+) is output from output terminal TA. The common collector terminal of transistors 32, 34 is connected to an output terminal TB. Output current (Out−) is output from output terminal TB.

According to the third embodiment, the common emitter terminal of transistors 31, 32 and the common emitter terminal of transistors 33, 34 are connected to constant current sources 35, 36 via inductors 38, 39, respectively.

Therefore, in addition to the effects similar to the first embodiment, the amount of harmonics of input signals caused at nodes A, B, which are input to the common emitter terminal of transistors 31, 32 and the common emitter terminal of transistors 33, 34 is reduced. Since the direct current loss in inductors 38, 39 is small, the mixer circuit is suitable for low voltage operation.

Fourth Embodiment

Figure 4:
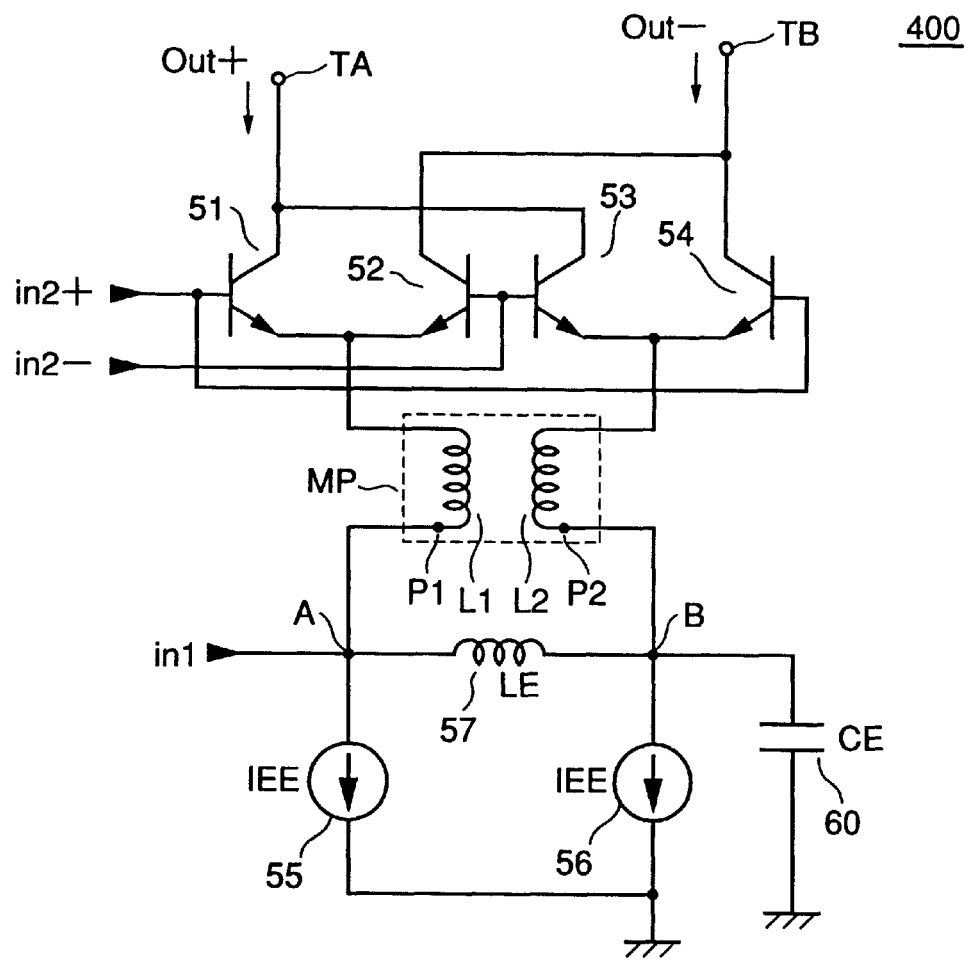
FIG. 4 is a circuit diagram of a mixer circuit 400 according to a fourth embodiment of the present invention.

A mixer circuit 400 according to a fourth embodiment will be described with reference to FIG. 4. Mixer circuit 400 includes constant current sources 55, 56, transistors 51 to 54, an inductor 57, a capacitor 60, and a transformer 58. Here, in1, in2+, in2−, Out+, and Out− denote a first input signal, a positive second input signal, a negative second input signal, a positive output current, and a negative output current, respectively.

Each of constant current sources 55, 56 supplies a constant current IEE. The inductance of inductor 57 is LE, and the capacitance of capacitor 60 is CE.

The emitter terminals of transistors 51, 52 are connected commonly to each other, and the emitter terminals of transistors 53, 54 are also connected commonly to each other. The collector terminals of transistors 51, 53 are connected commonly to each other, and the collector terminals of transistors 52, 54 are also connected commonly to each other. The base terminals of transistors 51, 54 are supplied with positive second input signal in2+, and the base terminals of transistors 52, 53 are supplied with negative second input signal in2−.

Transformer 58 includes first and second inductors L1, L2. The common emitter terminal of transistors 51, 52 is connected to constant current source 55 via a first port P1 of the first inductor. The common emitter terminal of transistors 53, 54 is connected to constant current source 56 via a second port P2 of the second inductor. The connection direction is a direction in which an inverted signal of a signal at node A is produced at node B. The mutual inductance of transformer 58 is MP.

Constant current source 55 is connected to node A, and constant current source 56 is connected to node B. Node A is connected to node B via inductor 57. Node B is connected to a ground via capacitor 60. First input signal in1 is input to node A.

The common collector terminal of transistors 51, 53 is connected to an output terminal TA. Output current (Out+) is output from output terminal TA. The common collector terminal of transistors 52, 54 is connected to an output terminal TB. Output current (Out−) is output from output terminal TB.

According to the fourth embodiment, in addition to the effects similar to the first embodiment, the phase difference between input signals at nodes A, B is corrected to be closer to 180°.

Fifth Embodiment

Figure 5:
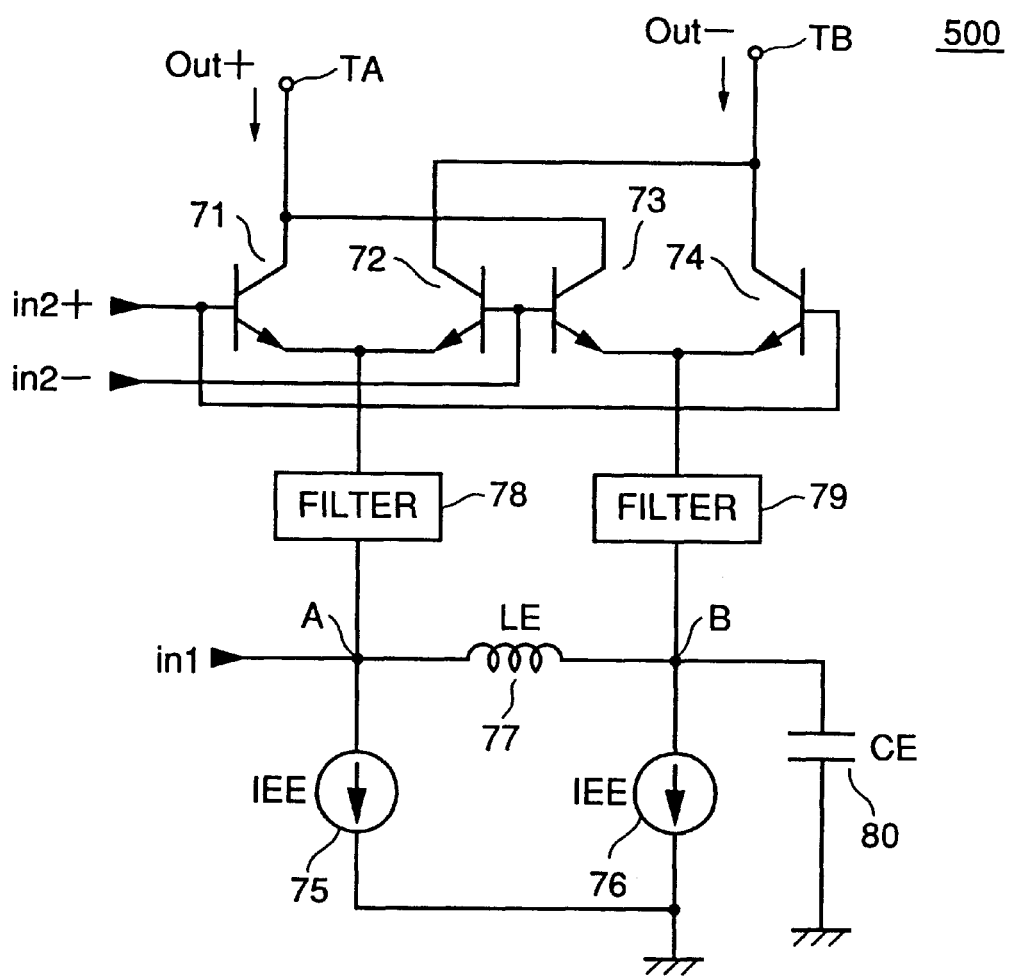
FIG. 5 is a circuit diagram of a mixer circuit 500 according to a fifth embodiment of the present invention.

A mixer circuit 500 according to a fifth embodiment will be described with reference to FIG. 5. Mixer circuit 500 includes constant current sources 75, 76, transistors 71 to 74, an inductor 77, a capacitor 80, and filters 78, 79. Here, in1, in2+, in2−, Out+, and Out− denote a first input signal, a positive second input signal, a negative second input signal, a positive output current, and a negative output current, respectively.

Each of constant current sources 75, 76 supplies a constant current IEE. The inductance of inductor 77 is LE and the capacitance of capacitor 80 is CE.

The emitter terminals of transistors 71, 72 are connected commonly to each other, and the emitter terminals of transistors 73, 74 are also connected commonly to each other. The collector terminals of transistors 71, 73 are connected commonly to each other, and the collector terminals of transistors 72, 74 are also connected commonly to each other. The base terminals of transistors 71, 74 are supplied with positive second input signal in2+, and the base terminals of transistors 72, 73 are supplied with negative second input signal in2−.

The common emitter terminal of transistors 71, 72 is connected to constant current source 75 via filter 78. The common emitter terminal of transistors 73, 74 is connected to constant current source 76 via filter 79. Constant current source 75 is connected to node A, and constant current source 76 is connected to node B. Node A is connected to node B via inductor 77. Node B is connected to a ground via capacitor 80. First input signal in1 is input to node A.

The common collector terminal of transistors 71, 73 is connected to an output terminal TA. Output current (Out+) is output from output terminal TA. The common collector terminal of transistors 72, 74 is connected to an output terminal TB. Output current (Out−) is output from output terminal TB. According to the fifth embodiment, in addition to the foregoing, the amount of the harmonics of input signal caused at nodes A and B, which are input to the common emitter terminal of transistors 71, 72 and the common emitter terminal of transistors 73, 74 is reduced.

Sixth Embodiment

Figure 6:
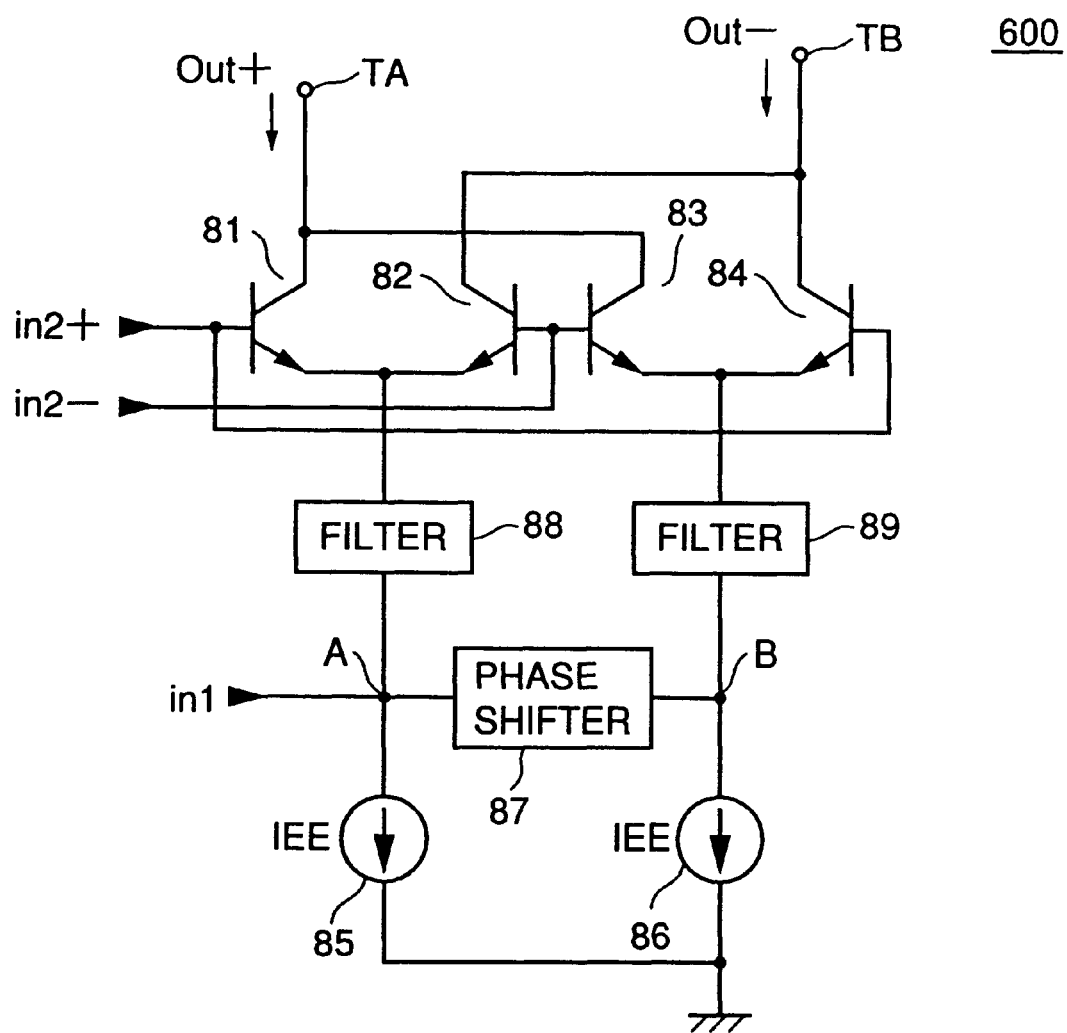
FIG. 6 is a circuit diagram of a mixer circuit 600 according to a sixth embodiment of the present invention.

A mixer circuit 600 according to a sixth embodiment will be described with reference to FIG. 6. Mixer circuit 600 includes constant current sources 85, 86, transistors 81 to 84, a phase shifter 87, and filters 88, 89. Here, in1, in2+, in2−, Out+, and Out− denote a first input signal, a positive second input signal, a negative second input signal, a positive output current, and a negative output current, respectively.

Each of constant current sources 85, 86 supplies a constant current IEE.

The emitter terminals of transistors 81, 82 are connected commonly to each other, and the emitter terminals of transistors 83, 84 are also connected commonly to each other. The collector terminals of transistors 81, 83 are connected commonly to each other, and the collector terminals of transistors 82, 84 are also connected commonly to each other. The base terminals of transistors 81, 84 are supplied with positive second input signal in2+, and the base terminals of transistors 82, 83 are supplied with negative second input signal in2−.

The common emitter terminal of transistors 81, 82 is connected to constant current source 85 via filter 88. The common emitter terminal of transistors 83, 84 is connected to constant current source 86 via filter 89. Constant current source 85 is connected to node A, and constant current source 86 is connected to node B. Node A is connected to node B via phase shifter 87. First input signal in1 is input to node A.

The common collector terminal of transistors 81, 83 is connected to an output terminal TA. Output current (Out+) is output from output terminal TA. The common collector terminal of transistors 82, 84 is connected to an output terminal TB. Output current (Out−) is output from output terminal TB.

Figure 7A:
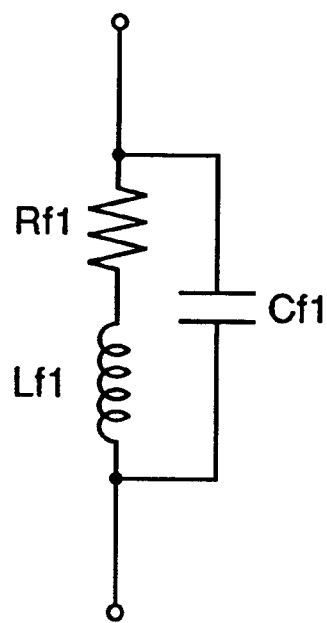
FIGS. 7A and 7B show the structures of a filter in mixer circuit 600 according to the sixth embodiment.
Figure 7B:
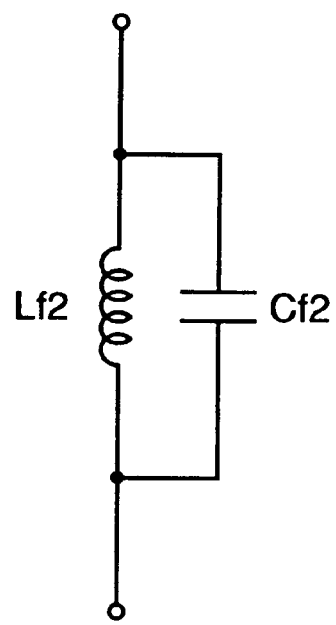

Phase shifter 87 is not limited to an LC phase shifter but any phase shifter may be employed. Specific structures of filters 88, 89 will be shown in FIGS. 7A and 7B. FIG. 7A shows a structure in which a resistor Rf1 and an inductor Lf1 are connected in series and a capacitor Cf1 is connected in parallel with them. FIG. 7B shows a structure in which an inductor Lf2 and a capacitor Cf2 are connected in parallel.

According to the sixth embodiment, in addition to the foregoing, the amount of harmonics of input signals caused at nodes A, B, which are input to the common emitter terminal of transistors 81, 82 and the common emitter terminal of transistors 83, 84 is reduced.

Seventh Embodiment

Figure 8:
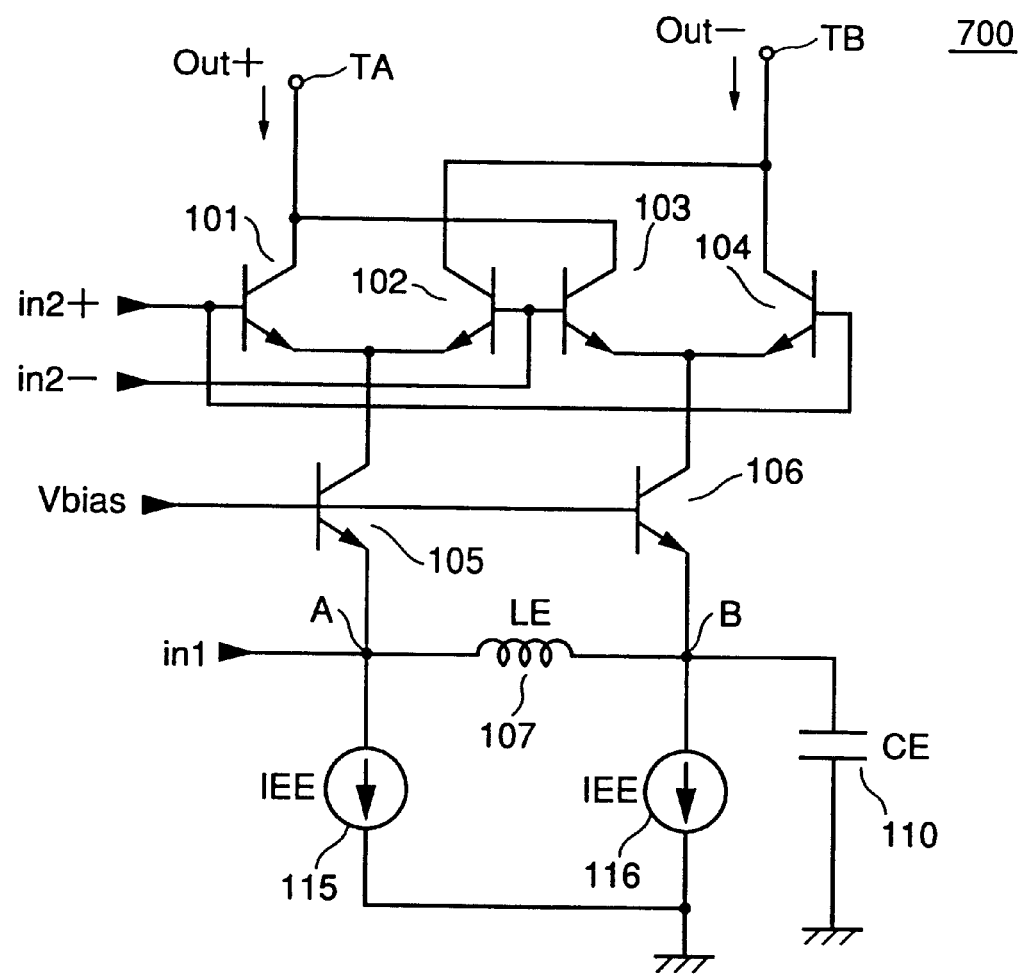
FIG. 8 is a circuit diagram of a mixer circuit 700 according to a seventh embodiment of the present invention.

A mixer circuit 700 according to a seventh embodiment will be described with reference to FIG. 8. Mixer circuit 700 includes constant current sources 115, 116, transistors 101 to 104, an inductor 107, a capacitor 110, and transistors 105, 106 which have their bases biased by a constant voltage Vbias. Here, in1, in2+, in2−, Out+, and Out− denote a first input signal, a positive second input signal, a negative second input signal, a positive output current, and a negative output current, respectively.

Each of constant current sources 115, 116 supplies a constant current IEE. The inductance of inductor 107 is LE, and the capacitance of capacitor 110 is CE.

The emitter terminals of transistors 101, 102 are connected commonly to each other, and the emitter terminals of transistors 103, 104 are also connected commonly to each other. The collector terminals of transistors 101, 103 are connected commonly to each other, and the collector terminals of transistors 102, 104 are also connected commonly to each other. The base terminals of transistors 101, 104 are supplied with positive second input signal in2+, and the base terminals of transistors 102, 103 are supplied with negative second input signal in2−.

The common emitter terminal of transistors 101, 102 is connected to the collector terminal of transistor 105. The common emitter terminal of transistors 103, 104 is connected to the collector terminal of transistor 106. The emitter terminals of transistors 105, 106 are connected to constant current sources 115, 116, respectively.

Constant current source 115 is connected to node A, and constant current source 116 is connected to node B. Node A is connected to node B via inductor 107. Node B is connected to a ground via capacitor 110. First input signal in1 is input to node A.

The common collector terminal of transistors 101, 103 is connected to an output terminal TA. Output current (Out+) is output from output terminal TA. The common collector terminal of transistors 102, 104 is connected to an output terminal TB. Output current (Out−) is output from output terminal TB.

According to the seventh embodiment, the emitter resistance caused at nodes A, B is the emitter resistance of the biased transistors and thus linear. Therefore, the distortion in the mixer circuit can be reduced.

Eighth Embodiment

Figure 9:
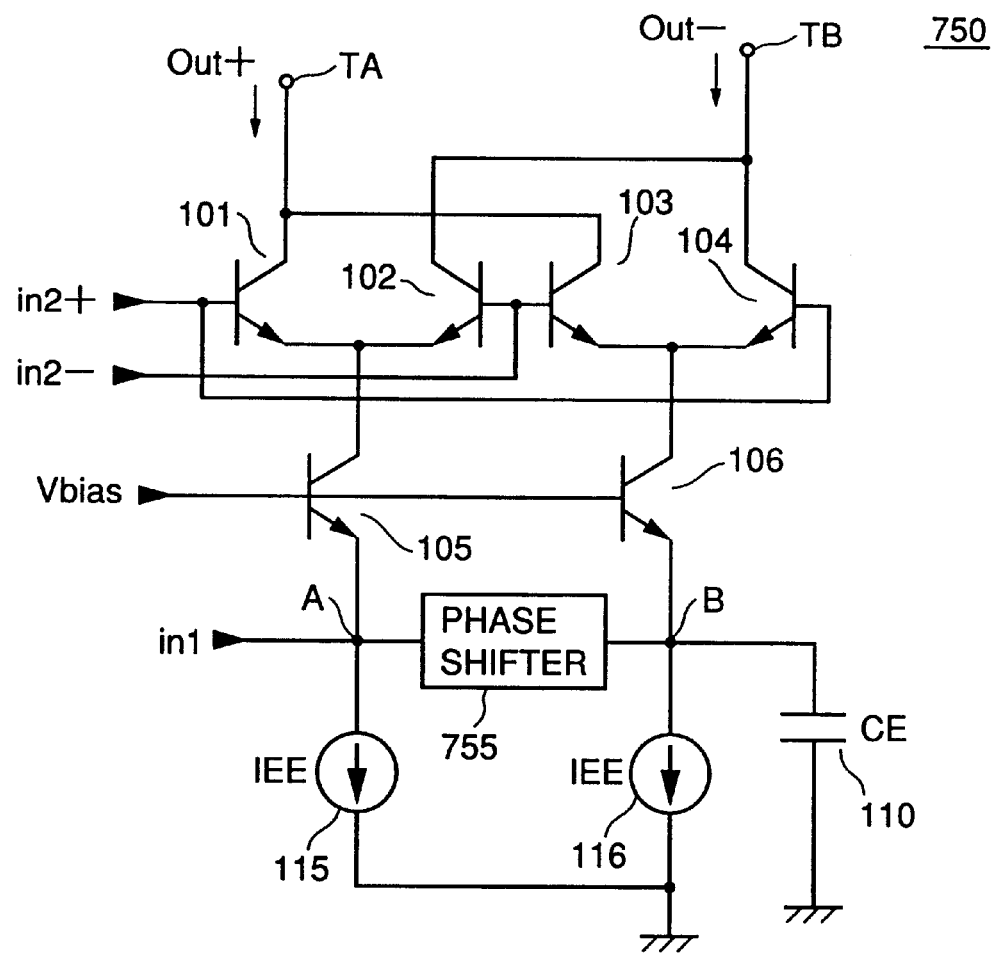
FIG. 9 is a circuit diagram of a mixer circuit 750 according to an eighth embodiment of the present invention.

A mixer circuit 750 according to an eighth embodiment will be described with reference to FIG. 9. Mixer circuit 750 includes constant current sources 115, 116, transistors 101 to 104, a phase shifter 755, a capacitor 110, and transistors 105, 106 which have their bases biased by a constant voltage Vbias.

Mixer circuit 750 in the eighth embodiment has phase shifter 755 instead of inductor 107 in the seventh embodiment. Even in such a structure, similar effects to those of the seventh embodiment are attained.

Ninth Embodiment

Figure 10:
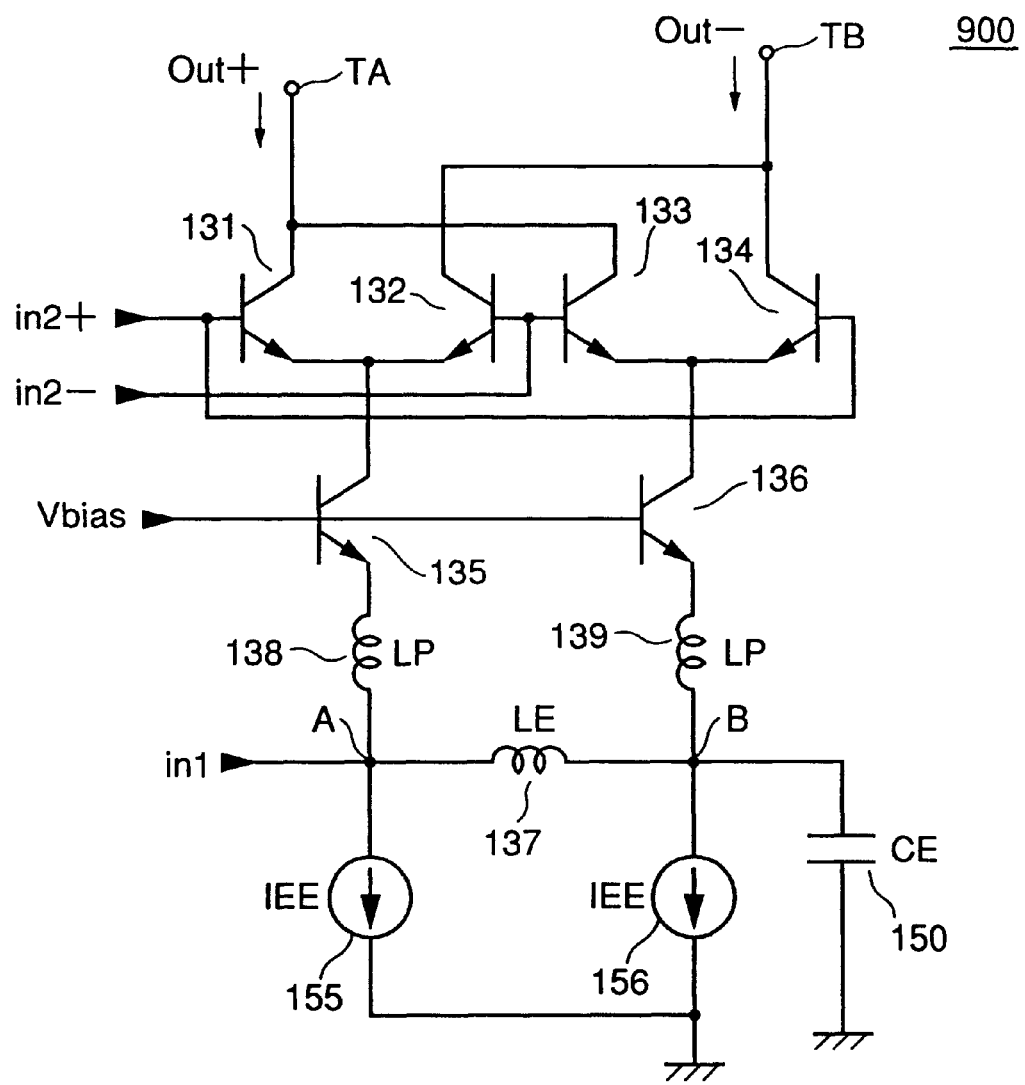
FIG. 10 is a circuit diagram of a mixer circuit 900 according to a ninth embodiment of the present invention.

A mixer circuit 900 according to a ninth embodiment will be described with reference to FIG. 10. Mixer circuit 900 includes constant current sources 155, 156, transistors 131 to 134, inductors 137 to 139, a capacitor 150, and transistors 135, 136 which have their bases biased by a constant voltage Vbias. Here, in1, in2+, in2−, Out+, and Out− denote a first input signal, a positive second input signal, a negative second input signal, a positive output current, and a negative output current, respectively.

Each of constant current sources 155, 156 supplies a constant current IEE. The inductance of inductor 137 is IE, and the inductance of each of inductors 138, 139 is LP. The capacitance of capacitor 150 is CE.

The emitter terminals of transistors 131, 132 are connected commonly to each other, and the emitter terminals of transistors 133, 134 are also connected commonly to each other. The collector terminals of transistors 131, 133 are connected commonly to each other, and the collector terminals of transistors 132, 134 are also connected commonly to each other. The base terminals of 131, 134 are supplied with positive second input signal in2+, and the base terminals of transistors 132, 133 are supplied with negative second input signal in2−.

The common emitter terminal of transistors 131, 132 is connected to the collector terminal of transistor 135. The common emitter of transistors 133, 134 is connected to the collector of transistor 136. The emitter terminals of transistors 135, 136 are connected to constant current sources 155, 156 via inductors 138, 139, respectively.

Constant current source 155 is connected to node A, and constant current source 156 is connected to node B. Node A is connected to node B via inductor 137. Node B is connected to a ground via capacitor 150. First input signal in1 is input to node A.

The common collector terminal of transistors 131, 133 is connected to an output terminal TA. Output current (Out+)

is output from output terminal TA. The common collector terminal of transistors 132, 134 is connected to an output terminal TB. Output current (Out−) is output from output terminal TB.

According to the ninth embodiment, the direct current loss in inductors 138, 139 is small and it is suitable for low voltage operation. Since the emitter resistance caused at nodes A, B is the emitter resistance of the biases transistors and thus linear, the distortion can be reduced.

Tenth Embodiment

Figure 11:
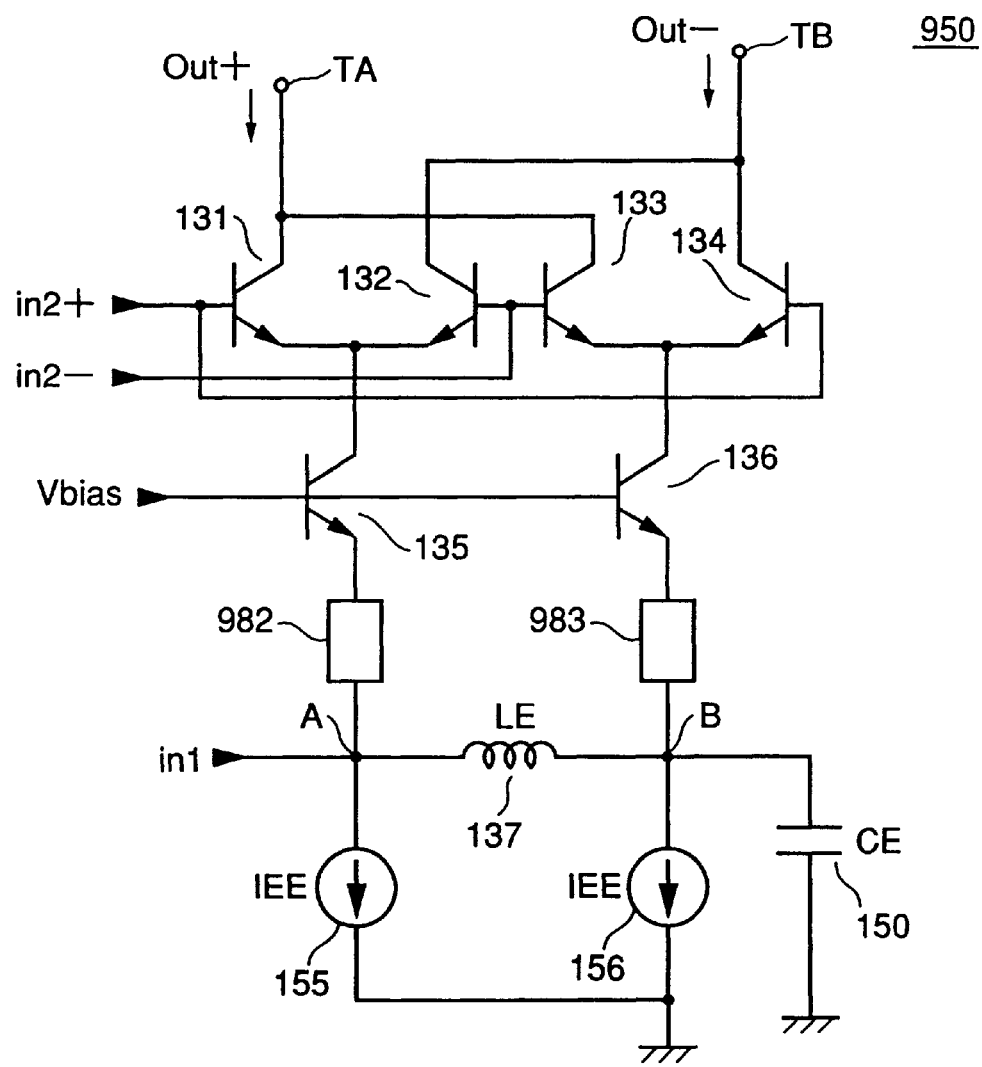
FIG. 11 is a circuit diagram of a mixer circuit 950 according to a tenth embodiment of the present invention.
Figure 12:
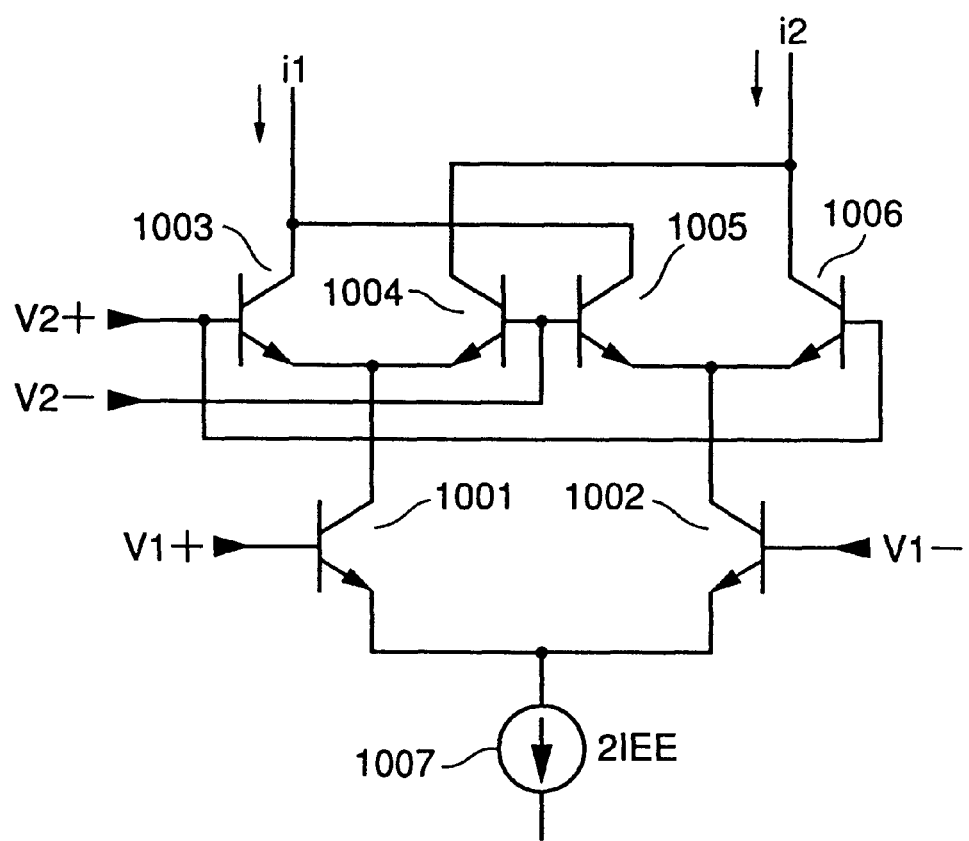
FIG. 12 is a circuit diagram of a conventional Gilbert cell type mixer circuit 1000.
Figure 13:
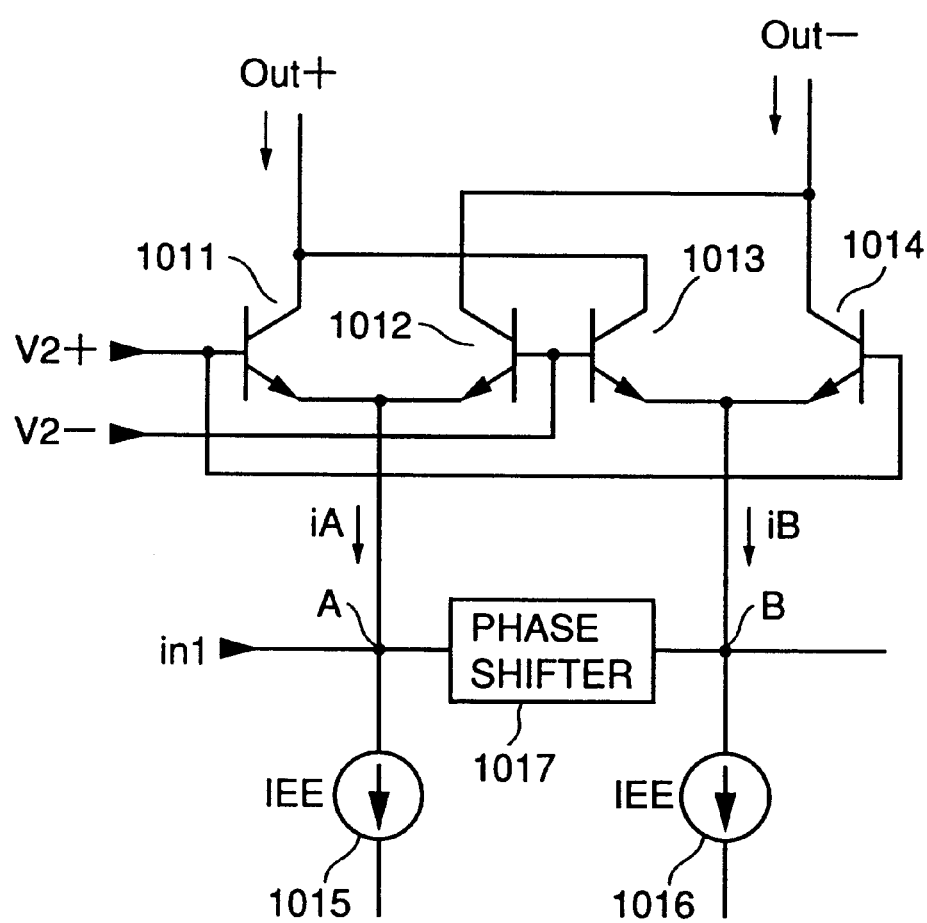
FIG. 13 is a circuit diagram of a conventional low voltage type mixer circuit 1100.
Figure 14:
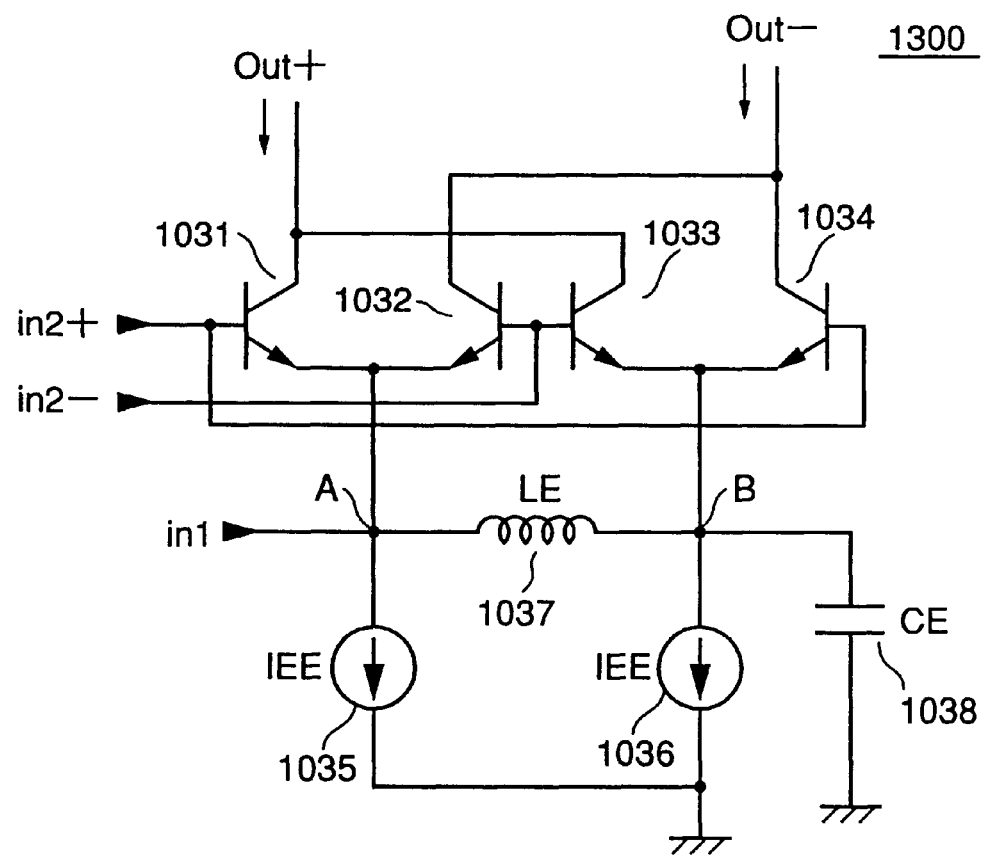
FIG. 14 is a circuit diagram of a conventionl low voltage type mixer circuit 1300.

A mixer circuit 950 according to a tenth embodiment will be described with reference to FIG. 11. Mixer circuit 950 includes constant current sources 155, 156, impedance elements 982, 983 which are not open to direct current, transistors 131 to 134, an inductor 137, a capacitor 150, and transistors 135, 136 which have their bases biased by a constant voltage Vbias.

Mixer circuit 950 in the tenth embodiment has impedance elements 982, 983, which are not open to direct current, instead of inductors 138, 139 in the ninth embodiment. Even in such a structure, similar effects to those of the ninth embodiment are attained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A mixer circuit, comprising:

a first node to which a first input signal is input;

a second node;

a first output terminal from which a first component of an output signal is output;

a second output terminal from which a second component of the output signal is output;

a first transistor having a first control electrode to which a first component of a second input signal is input, a first electrode connected to said first output terminal, and a second electrode;

a second transistor having a second control electrode to which a second component of said second input signal is input, a third electrode connected to said output terminal, and a fourth electrode;

a third transistor having a third control electrode to which the second component of said second input signal is input, a fifth electrode connected to said first output terminal, and a sixth electrode;

a fourth transistor having a fourth control electrode to which the first component of said second input signal is input, a seventh electrode connected to said second output terminal, and an eighth electrode;

a current source to supply a prescribed current to said first node and said second node;

a phase conversion circuit provided between said first node and said second node to convert a phase of a signal at said first node and supply it to said second node;

a fifth transistor provided between a first connection node for connecting said second electrode and said fourth electrode and said first node and having a fifth control electrode receiving a prescribed bias voltage; and a sixth transistor provided between a second connection node for connecting said sixth electrode and said eighth electrode and said second node and having a sixth control electrode receiving said prescribed bias voltage.

2. The mixer circuit according to claim 1, wherein said phase conversion circuit includes an inductor connected between said first node and said second node, and a capacitance element connected between said second node and a node supplied with a ground voltage.

3. The mixer circuit according to claim 1, wherein said phase conversion circuit includes a 180° phase converter to convert a phase of a signal at said first node by 180° and supply it to said second node.

4. The mixer circuit according to claim 1, further comprising:

a first inductor provided between said first node and said fifth transistor; and a second inductor provided between said second node and said sixth transistor.

5. The mixer circuit according to claim 1, further comprising:

a first impedance element, which is not open to direct current, provided between said first node and said fifth transistor; and a second impedance element, which is not open to direct current, provided between said second node and said sixth transistor.

* * * * *